United States Patent [19]
Vavrek et al.

[11] Patent Number: 5,185,576
[45] Date of Patent: Feb. 9, 1993

[54] LOCAL GRADIENT COIL

[75] Inventors: Robert M. Vavrek; Daniel J. Schaefer, both of Waukesha; Christopher C. Myers, Milwaukee; Thomas G. McFarland, Hartland, all of Wis.; Robert Turner, Bethesda, Md.

[73] Assignees: General Electric Company, Milwaukee, Wis.; The United States of America as represented by the Secretary of the Department of Health and Human Services, Washington, D.C.

[21] Appl. No.: 743,550

[22] Filed: Aug. 12, 1991

[51] Int. Cl.⁵ .......................................... G01R 33/20
[52] U.S. Cl. .................................... 324/318; 335/299
[58] Field of Search ............... 335/299; 324/300, 307, 324/309, 318, 319, 320, 322; 128/653.5

[56] References Cited

U.S. PATENT DOCUMENTS

| | | | |
|---|---|---|---|
| 4,978,920 | 12/1990 | Mansfield et al. | 324/318 |
| 5,036,282 | 7/1991 | Morich et al. | 324/318 |
| 5,146,197 | 9/1992 | Lowe | 335/299 |

OTHER PUBLICATIONS

"Echo-Planar Imaging of Diffusion and Perfuson: Magnetic Resonance in Medicine 19", 247-253 (1991), Robert Turner, et al.

"Echo-Planar Imaging of Intravoxel Incoherent Motion", Radiology 1990, vol. 177, No. 2, Nov. 1990, Robert Turner PhD. et al.

"Single Shot Echo-Planar Imaging" (admitted prior art from poster presented at 1989 SMRM conference).

Primary Examiner—Michael J. Tokar
Attorney, Agent, or Firm—Quarles & Brady

[57] ABSTRACT

A compact local gradient coil is combined with a local RF coil to provide lower powered, higher strength gradient fields and faster gradient response as is useful in magnetic resonance imaging. Interference between the RF coil and gradient coil is minimized by placement of the gradient coil external to the RF coil and by gradient coils that are axially symmetric and/or have conductors substantially orthogonal to the RF coil conductors. Acoustic noise in these smaller, stronger coils is reduced with ports cut into the coil forms.

12 Claims, 3 Drawing Sheets

LOCAL GRADIENT COIL

BACKGROUND OF THE INVENTION

1. Field of the Invention

The field of the invention is magnetic resonance imaging (MRI) and, in particular, gradient coils for use with MRI systems.

2. Background Art

Magnetic Resonance Imaging

In MRI, a uniform polarizing magnetic field $B_0$ is applied to an imaged object along the z-axis of a Cartesian coordinate system, the origin of which is approximately centered within the imaged object. The effect of the magnetic field $B_0$ is to align the object's nuclear spins along the z-axis.

In response to a radio frequency (RF) excitation signal of the proper frequency, oriented within the x-y plane, the nuclei precess about the z-axis at their Larmor frequencies according to the following equation:

$$F = \gamma B_0 \tag{1}$$

where F is the Larmor frequency, and $\gamma$ is the gyromagnetic ratio which is constant and a property of the particular nuclei.

Water, because of its relative abundance in biological tissue and the properties of its nuclei, is of principle concern in such imaging. The value of the gyromagnetic ratio $\gamma$ for water is 4.26 kHz/gauss and therefore, in a 1.5 Tesla polarizing magnetic field $B_0$, the resonant or Larmor frequency of water is approximately 63.9 MHz.

In a typical imaging sequence, the RF excitation signal is centered at the Larmor frequency F and applied to the imaged object at the same time as a magnetic field gradient $G_z$ is applied. The gradient $G_z$ varies the strength of the magnetic field $B_0$ along the z-axis and, therefore, causes only the nuclei in a single slice through the object along an x-y plane to have the resonant frequency F and to be excited into resonance.

After the excitation of the nuclei in this slice, similar magnetic field gradients are applied along the x and y axes. The gradient along the x-axis, $G_x$, causes the nuclei to precess at different frequencies, depending on their position along the x-axis, that is, $G_x$ spatially encodes the precessing nuclei by frequency. The y-axis gradient, $G_y$, is incremented through a series of values and encodes y position into the rate of change of phase of the precessing nuclei as a function of gradient amplitude, a process typically referred to as phase encoding.

A weak nuclear magnetic resonance generated by the precessing nuclei may be sensed by the RF antenna "coil" and recorded as an NMR signal. Typically, the NMR signal is detected along two perpendicular axes to produce a quadrature signal having a real and an "imaginary" part. From this quadrature NMR signal, a slice image may be derived according to well-known reconstruction techniques. A basic overview MRI image reconstruction is contained in the book "Magnetic Resonance Imaging, Principles and Applications" by D. N. Kean and M. A. Smith.

Polarizing, Gradient and RF Field Coils

The polarizing magnetic field $B_0$, for field strengths above approximately 0.2 Tesla, is typically produced by superconducting coils arranged along the z-axis and around a bore tube. The field is adjusted to be highly homogeneous in a spherical volume centered within the bore tube.

Gradient coils, for impressing the magnetic gradients, $G_x$, $G_y$ and $G_z$, on the uniform magnetic field $B_0$, are ordinarily affixed to the bore tube. Strong repulsive forces are generated between each gradient coil and, therefore, the gradient coils are typically firmly attached to the bore tube and restrained by laminated epoxy and glass fiber. The gradient coil restraints resist such forces and reduce the acoustic noise generated by the flexing of the gradient windings.

An RF coil is also affixed to the bore tube and may be a cage like antenna having end-loops opposed along the z-axis and interconnected by a series of segments 26 spaced circumferentially about the end-loops 24. Such coils are taught, for example, in U.S. Pat. Nos. 4,694,255, 4,692,705, and 4,680,548, and incorporated by reference.

The polarizing, gradient, and the RF coils are positioned on the outside of the bore tube so as not to interfere with placement of the patient in the bore tube for scanning. For maximum flexibility in medical applications, the bore tube is made large enough to permit the patient's entire body to be positioned within the bore tube taking into account expected variation in body dimensions between patients.

Gradient Field Speed Limitations

It would be desirable to greatly increase the strength and speed of the gradients $G_x$, $G_y$, and $G_z$. Gradient "speed" is the time required to change the magnitude of the gradient field between particular values. For most imaging techniques, higher gradient strength and response speed will decrease the time needed to acquire the NMR data required for an image. In particular, faster gradients reduce the time required to complete the MRI gradient pulse sequences and stronger gradients decrease the time needed to sample the received NMR signal by increasing the bandwidth of the NMR signal. Particularly in echo-planar imaging, where a single excitation produces a series of echoes, which are gradient encoded to generate image data, high gradient strength and speed is necessary to realize the full potential of rapid acquisition promised by this technique. Stronger gradients also increase the spatial resolution of the imaging process permitting smaller voxels to be discerned.

Also, for a number of specialized imaging techniques, higher gradient strength increases the "contrast" of the acquired data. This is true in flow and diffusion studies where the received NMR signal indicates the rate of flow of blood or other material, and in spectrographic studies, to measure the chemical shift between tissues caused by differing values of $\gamma$.

Both the response speed and the strength of the gradient field may be increased by increasing the power applied to the gradient coils. For a given geometry of gradient coil having a fixed inductance, the response time of the gradient coil, i.e. the amount of time required for the coil to reach a particular field strength, will depend on the applied current and hence, generally, on the available power.

The power applied to the gradient coil is typically provided by dedicated gradient amplifiers. Therefore, increasing the maximum power that may be applied to a gradient coil is accomplished by increasing the power of each amplifier or by stacking additional amplifiers together.

There are practical limits to increasing gradient speed and strength by increasing the power applied to the gradient coil. The first limit is the cost of the gradient amplifiers. An increase by a factor of 5-50 increase in gradient power, over that required for more conventional imaging, may be desired. The cost of the amplifiers needed to produce this power is prohibitive. The second limit is the power dissipation of the gradient coil. High gradient fields may require currents as high as 1000 amperes, such current levels creating significant coil cooling problems. Cooling techniques such as circulating refrigerant among the gradient coil windings may be used but add significantly to the cost of the MRI system.

SUMMARY OF THE INVENTION

The present invention increases gradient speed by employing a local gradient coil that has a substantially smaller radius than the gradient coils affixed to the coil bore. Generally, the strength of a gradient produced by a gradient coil, for a given number of ampere-turns, will increase to the fifth power with a given decrease in coil radius. Alternatively, some gradient strength may be traded off for fewer wire turns and hence less inductance, the lower inductance permitting faster gradient speed at a given level of gradient voltage.

Thus the present invention allows increased gradient speed and strength, without a corresponding increase in the gradient power. The gradient coil may be sized to the specific region of the body to be imaged (e.g., the head, the spine, the limbs, the heart, or the jaw) and is substantially smaller than the bore tube.

A number of problems arise in reducing the size of gradient coils and increasing the strength of the fields generated by these coils including: electrical interference between the gradient coils and the RF coil, constraints in the coil geometry imposed by patient anatomy, increased acoustic noise from the smaller and lighter coil forms, and problems of patient comfort associated with smaller coil enclosures. The present invention addresses these problems.

Specifically, a coil form is constructed within the bore, the coil form defining a local imaging volume near the patient and including a surface for holding the patient in a predetermined position with respect to the coil form. A gradient coil is affixed to the coil form for imposing a substantially linear magnetic gradient along a first axis with respect to the polarizing field and within the local imaging volume, and an RF coil is affixed to the coil form within the gradient coil for generating a radio frequency magnetic field within the local imaging volume.

It is one object of the invention to reduce the electrical interference between the local RF coil and the local gradient coil. The conductors of the gradient coil can change the tuning of the RF coil and distort the RF field causing shading artifacts in the reconstructed image and possible increased RF power deposition to some volumes of the patient. Additionally, interaction between these coils reduces the Q of the RF coil and can destroy its quadrature sensitivity. Placing the gradient coils on the outside of the RF coils removes them from the region of highest RF field strength and thus reduces their effect on the RF field. Placing the gradient coils outside the RF coil also permits the use of an interposed RF shield to prevent interaction between the RF coil and gradient coils.

The gradient may be generated by a Maxwell pair of axially symmetric coils having helically connected windings. The coils and helical connections are substantially perpendicular to the current carrying segments of the RF coil for minimum interaction. Interaction of the RF coil and the gradient coils can also unbalance the quadrature resonance of certain types of RF coils converting them to single mode coils with a subsequent loss of signal-to-noise ratio. The axially symmetric Maxwell pair avoids this unbalancing.

It is another object of the invention to provide increased patient comfort, specifically, when employing the local gradient coils in head imaging. The Maxwell pair permits a view port to be cut in the coil form without interfering with the gradient coil windings.

The coil form may include tuning apertures to change the natural mechanical resonance of the smaller coil form.

Thus, it is yet another object of the invention to reduce the acoustic noise generated with the lighter coil form used with a local coil. The ports serve to reduce the total vibrating surface area and to shift the resonant nodes of the coil form surface away from the spectral peaks of the gradient excitation waveform.

The foregoing and other objects and advantages of the invention will appear from the following description. In the description, reference is made to the accompanying drawings which form a part hereof and in which there is shown by way of illustration, several preferred embodiments of the invention. Such embodiments do not necessarily represent the full scope of the invention, however, and reference must be made therefore to the claims herein for interpreting the scope of the invention.

DETAILED DESCRIPTION OF THE PREFERRED EMBODIMENT

Figure 1:
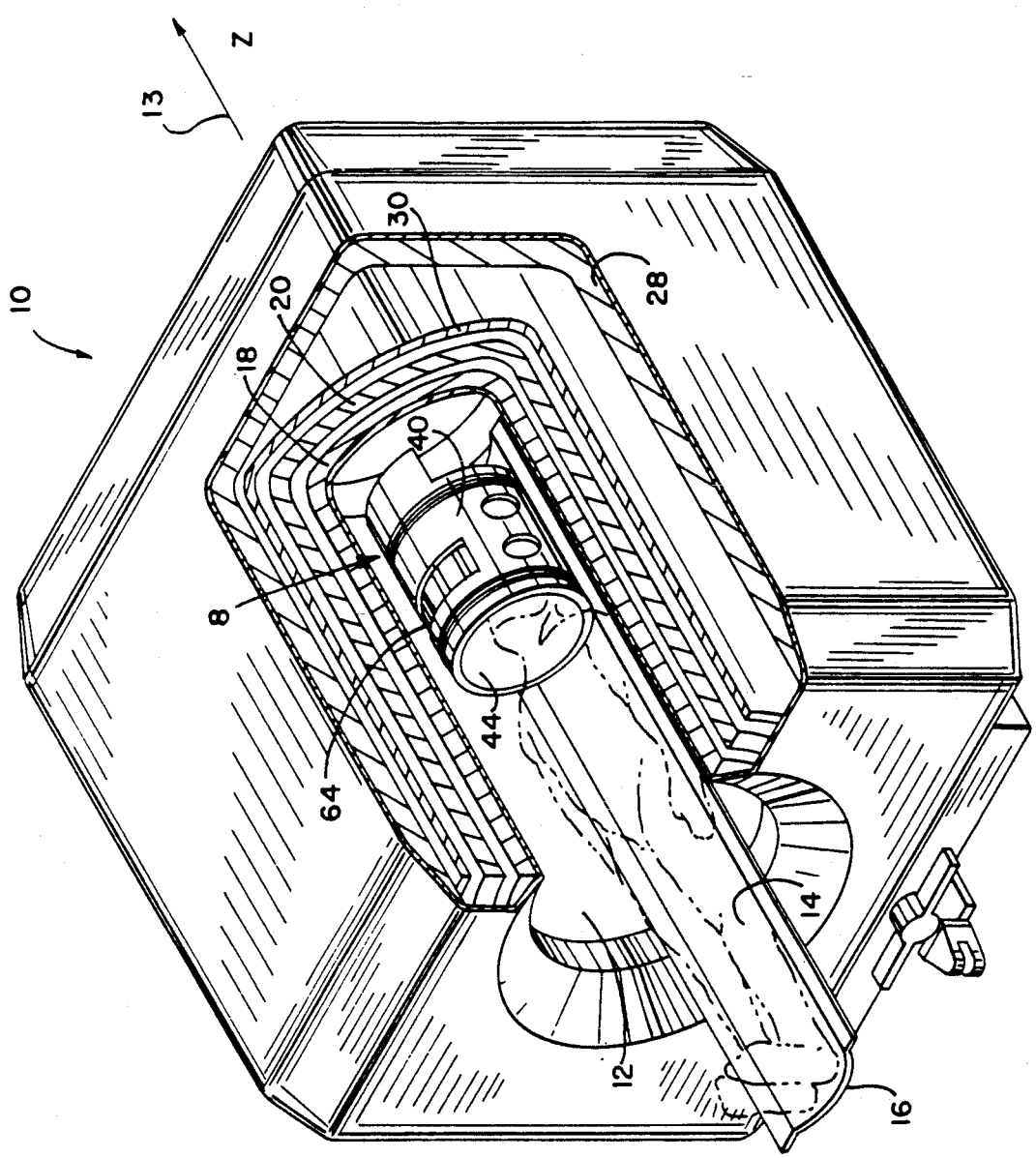
FIG. 1 is a perspective, cut-away view of an MRI magnet showing the placement of the polarizing coils, the gradient coils, and the RF coils on the bore tube and showing the placement of the local gradient and RF coil of the present invention about the head of the patient.

Referring to FIG. 1, an MRI magnet assembly 10 has a cylindrical bore tube 12 extending along a z-axis 13 for receiving a supine patient 14 supported on a radiolucent table 16. The table 16 may move in and out of the bore tube 12 so as to position the patient 14 along the z-axis 13 within the volume of the bore tube 12.

Coaxially surrounding the bore tube 12 is an RF coil 18 for exciting the spins of the patient 14 into resonance, as has been described. Gradient coils 20 surround both the bore tube 12 and the RF coil 18 and are also co-axial with the z-axis 13, to provide x, y, and z gradient fields $G_x$, $G_y$ and $G_z$ as required for MRI imaging. The gradient coils 20 are driven by gradient amplifiers (not shown). The polarizing magnetic field $B_0$, aligned with the z-axis 13, is generated by a superconducting magnet coil 28 coaxial with but outside the bore tube 12, the RF coils 18, and the gradient coils 20. The superconducting magnet coil 28 has no external power supply but operates on an initial current which continues unabated in the zero resistivity windings of the superconducting magnet coil 28.

Interposed between the superconducting magnet coil 28 and the gradient coil 20 is a set of shim coils 30 which are used to correct the homogeneity of the polarizing field $B_0$ as is understood in the art. A set of mechanical linkages and insulators (not shown) rigidly connect each of these coils 18, 20, 28 and 30 together to the bore tube 12 so as to resist such relative motions therebetween as may be generated by the interaction of their various electromagnetic fields.

The local coil assembly 8, of the present invention, is constructed about a cylindrical tube 40 sized to be received within the bore tube 12 when sitting on the table 16. The inside diameter of the bore tube 12 is approximately 22 inches whereas the inside diameter of the local coil assembly 8 is approximately 11 inches and thus the internal volume of the local coil assembly 8 more nearly approaches the volume of the patient's head.

The local coil assembly 8 is not directly attached to the bore tube 12 but rather is attached to the table 16 and thereby resists motion caused by the interaction of its fields with the coil 28 previously described. The table 16 may be moved along the z-axis 13 to position the local coil assembly 8 at the center of the bore tube 12, generally the position of greatest filed homogeneity for the polarizing magnetic field $B_0$ and the gradient fields $G_x$ and $G_y$.

A viewing port 64, to reduce the patient's sense of enclosure, allows the patient 18 to look out of the local coil assembly 8 when the patient's 18 head is positioned within the local coil assembly 8 with the patient's shoulders abutting the inferior end 44 of the local coil assembly 8.

Figure 2:
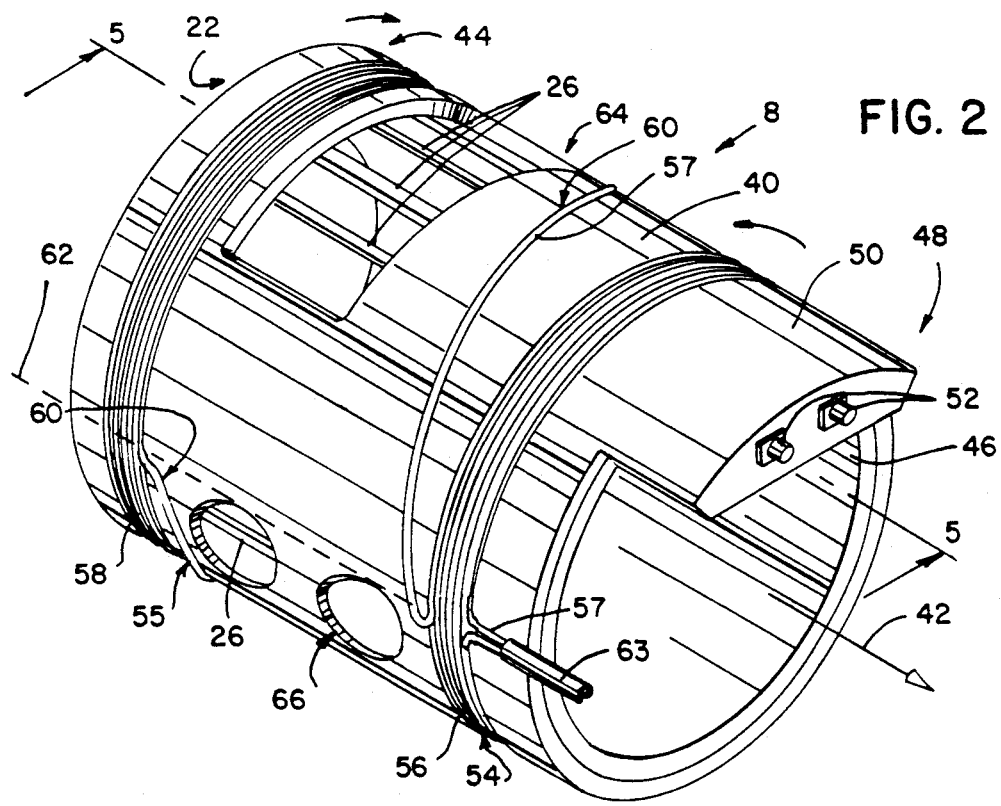
FIG. 2 is a perspective view of the local gradient coil and RF coil of FIG. 1.
Figure 3:
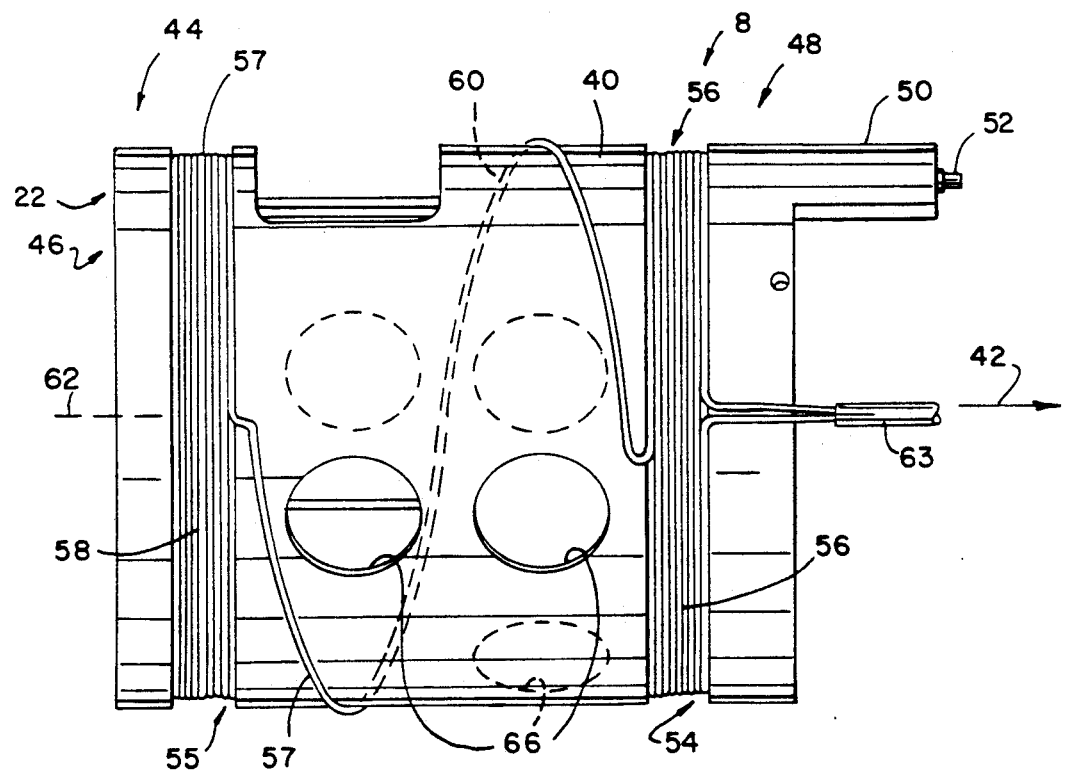
FIG. 3 is a view in elevation of the local gradient coil and RF coil of FIG. 2 showing the tuning ports and helical return wiring.

Referring to FIGS. 2 and 3, the tubular cylindrical form 40 has its axis 42 aligned within the B: field or z-axis 13 of the MRI magnet 10. The primary form 40 is constructed of a fiberglass tube with a nominal half inch wall thickness, however, it will be recognized that low loss dielectric materials of different dimensions may also be used.

Figure 4:
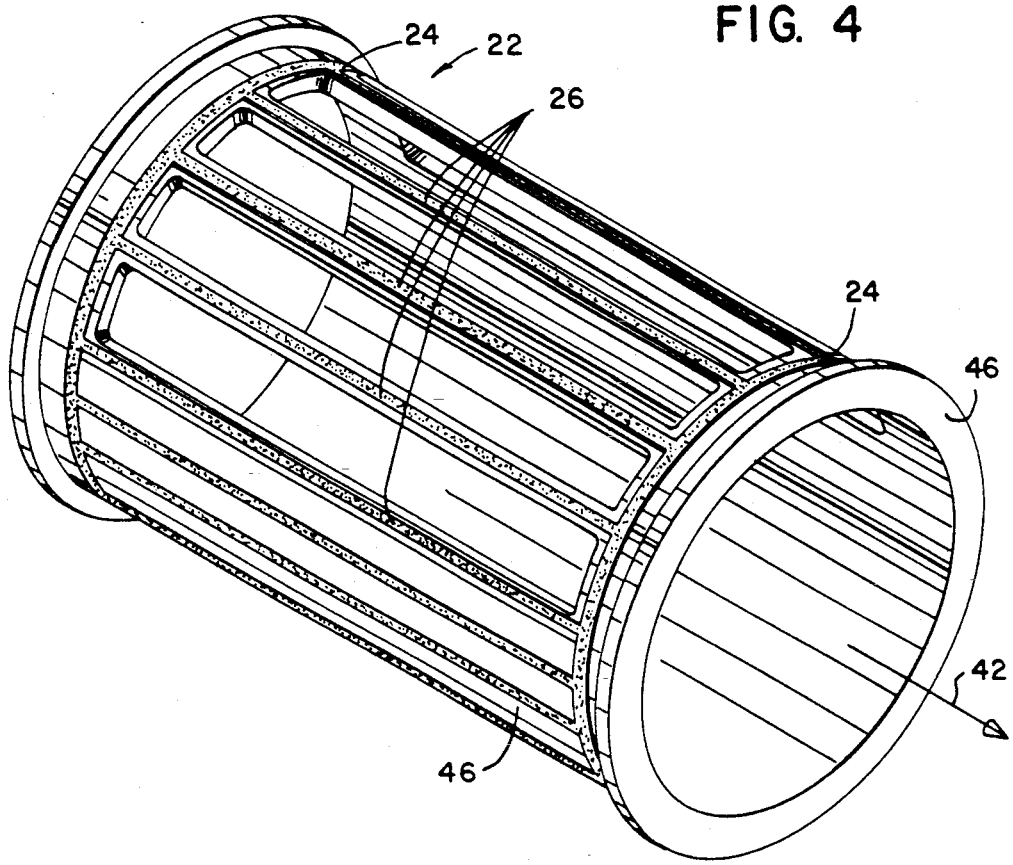
FIG. 4 is a perspective schematic representation of the RF coil of FIGS. 1, 2 and 3.
Figure 5:
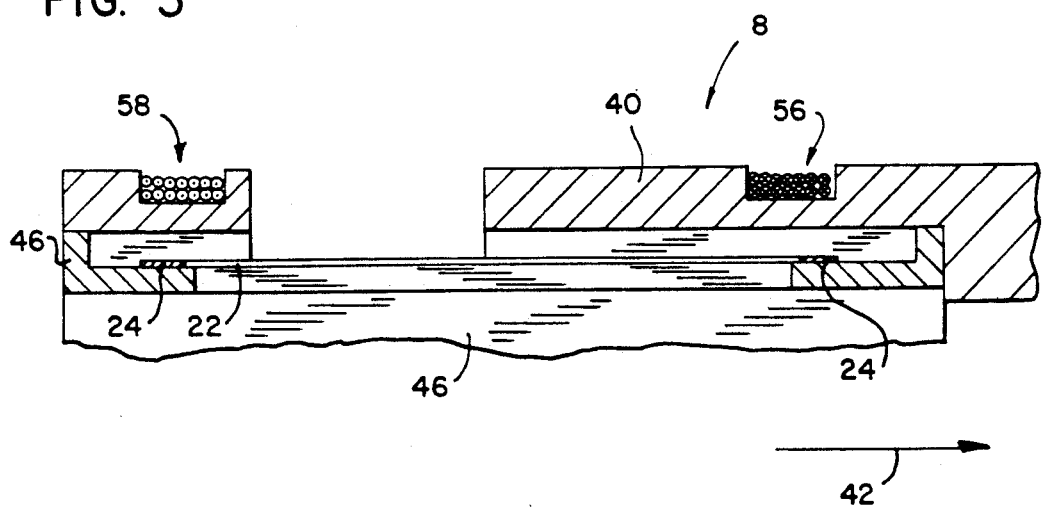
FIG. 5 is a cross-section through the wall of the gradient coil FIG. 2 along line 5—5 showing the relative location of the gradient coils and the direction of current flow through the windings thereof with respect to the RF coil structure.

Referring to FIGS. 2, 4 and 5, a secondary tubular form 46 fits coaxially within the primary form 40 to provide a surface for receiving the head of the patient 18 (shown in FIG. 1) through an inferior end 44 of the primary form 40 and supporting patient's head on positioning pads or the like (not shown).

Conductors for the local RF coil 24 are taped to the outer surface of the secondary tubular form 46 to be encased between the outer surface of the secondary form 46 and the inner surface of the primary form 40. Specifically, the local RF coil 22 is constructed in the form of the well known cage coil having conductive end-loops 24 opposed along and centered around the axis 42 and interconnected by a series of sixteen conductive segments 26 spaced circumferentially about the end-loops 24. Capacitors formed from insulated overlapping conductors in the segments break the end-loops 24 and/or the conductive segments 26 to form, together with the distributed inductance of the end loops 24, and the conductive segments 26, a resonant structure for producing a rotating RF vector for exciting the nuclear spins in an MRI imaging sequence as has been described. Such coils are taught, for example, in the previously cited U.S. Pat. No. 4,680,548.

The portion of the secondary form 46 between the conductive segments 26, not directly beneath the taped segments 26, are cut away on the upper half of the secondary form 26, to not interfere unduly with the patient's view through the viewing port 64.

A superior end 48 of the primary form 40 holds, at its upper rim, an axially extending tab 50 supporting two RF connectors 52 for supplying and receiving the quadrature RF signal to and from the RF coil 22, as is understood in the art.

Referring also to FIG. 3, the primary form 40 has circumferential channels 54 and 55 cut into its outer surface at both the inferior and superior ends 44 and 48, respectively, to receive conductor 57 forming solenoid coils 58 and 56 of a Maxwell pair for generating the z-axis gradient, $G_z$. A helical groove 60 joins with these two channels 54 and 55 at points along a midline 62 defined by a horizontal plane bisecting the primary form 40.

The conductor 57 of the coils 56 and 58 is wound from the superior edge of the superior channel 54 and proceeds toward the inferior edge of that channel 54 in a clockwise manner as viewed from the inferior end 44. The conductor 57 is then laid along the helical groove 60 to the superior side of the inferior channel 55 and is wound in a counterclockwise direction as viewed from the inferior end 44 until the inferior side of the inferior channel 55 is reached. A second layer of conductor 57 is then wound over top of the first layer of conductor 57 in the same counterclockwise direction in the inferior channel 55 toward the superior side of that channel and then laid to double back in the helical groove 60 to the inferior side of the superior channel 54 continuing clockwise over the previous layer of conductor until the superior side of the superior channel is reached. The conductor 57 in the helical groove 60 is termed the "return" and electrically connects the two coils 56 and 58. The two ends of the conductor 57 at the superior side of the superior channel 54 are attached to the z-axis gradient amplifier (not shown) via cable 63.

The current carrying segments 26 of the RF coil 22 are perpendicular to the windings of coils 58 and 56 and hence there is minimal inductive coupling between these elements. The helical groove 60 minimizes inductive coupling between the return conductor 57 carried in the helical groove 60, connecting the coils 56 and 58, and the RF coil 22, by maintaining a nearly perpendicular angle between the return conductor 57 and the segments 26 of the RF coil 22 and by distributing the parallel component of the return conductor 57, and hence its loading of the segments 26, around the circumference of the primary form 40 and equally among the segments 26. It is noted that two return conductors 57 carry current in opposite directions in the helical groove 60, thereby minimizing their net effect on the z-axis gradient field generated by coils 56 and 58.

Referring to FIG. 5, the current in the superior coil 56 travels around the primary form 40 in the opposite direction as the current in the inferior coil 56. The end loops 24 of the RF antenna 22 lie generally in the plane of coils 58 and 56. It is important that the end-loops 24 do not project beyond the plane of the coils 56 and 58 because the gradient field begins to drop off in these areas and spurious NMR signals would be generated from spins excited in these regions and aliased into the image.

Referring again to FIGS. 2 and 3, the generally rectangular viewing port 64 is cut in the upper surface of the primary form 40 between the coils 56 and 58, near coil 58 and is removed from the helical groove 60 to provide a window through which the patient 18 may look when the patient's head is in position within the primary form 40. The viewing port 64 is interrupted by the conductive segments 26 of the RF coil 22, however, these segments 26 are relatively thin and hence do not significantly obstruct the patient's vision.

Energization of the coils 56 and 58 produces strong vector cross-product forces between the local coil assembly 8 and the superconducting coils 28, which under conditions of periodic gradient excitation create audible vibrations. These vibrations may be reduced somewhat by limiting the audio frequency components of the gradient waveforms as taught by U.S. Pat. No. 4,680,545 and incorporated by reference. In addition, tuning ports 66 are cut in the body of the primary form 40 to reduce the audible vibrations. The exact placement of the ports 66 is a function of the dimensions, stiffness, and mass distribution of the primary form 40 with its associated windings 56 and 58 and is selected to meet the following objectives: 1) reduction of the total vibrating surface area of the primary form 40, 2) elimination of the antinodal points of vibration of primary form 40 at the relevant gradient signal frequencies, and 3) tuning of the primary form 40 away from the dominant frequencies of excitation of the gradient's signal. Desirably, the ports 66 should avoid the windings 56 and 58 and the helical groove 60.

Returning of the primary form 40 may also be accomplished through judicious choices of the other dimensions of the coil form 40 such as the thickness of the wall of coil form 40. Stiffening bars (not shown) attached to the coil from 40 either circumferentially or parallel to 42 may also be used. Such bars bridge nodal and antinodal points thus affecting the form's effective stiffness at its resonant frequency thus tuning the coil form 40 away from that frequency. The stiffening bars may be attached to the coil form 40 with screws to permit their movement to accommodate different imaging procedures with different gradient excitation frequencies.

The local gradient coil assembly 8 as described above, supplies only the z-axis gradient $G_z$. The x and y-axis gradients $G_x$, and $G_y$ are supplied by the gradient coils 20 on the bore tube shown in FIG. 1. The z-axis gradient $G_z$ on the bore tube 12, in this case, is deactivated, by routing the gradient amplifier to the local gradient coil assembly 8 through cable 62. The advantage of this mode of operation, using Only a local z-axis gradient, $G_z$, is that the view port 64 is unobstructed by additional local gradient coils and yet a decrease in imaging time is realized as a result of the faster and stronger z-axis gradient. The spatial resolution along the z-axis may also be increased.

The local gradient coil may not always be employed in the MRI scanner, and there will be occasions in which it is removed to allow scanning with the standard gradient coils 20. Although the local gradient coil 8 may be designed to have an inductance and a resistance matching its counterpart in the gradient coils 20, in general, this will not be the case. If the local gradient coil 8 has an inductance and resistance different from the corresponding gradient coil 20, then the gradient amplifier which drives the local gradient coil 8 may not be properly compensated for the change in coil impedance. In this case, the gradient amplifier may exhibit an underdamped or overdamped response to the gradient signals. In the worst case, the gradient amplifier may become unstable, driving damaging fluctuations of current into the coil. In any case, improper compensation of the gradient amplifiers will be detrimental to the image quality.

Accordingly, the presence of the local coil 8 is identified to the gradient amplifier by means of an extra pair of conductors on the gradient plug (not shown) which connects cable 63 to the gradient amplifiers. The extra pair of connectors provide a signal to the gradient amplifier, by being shorted or open, causing an electronic switch in the gradient amplifier to adjust the compensation appropriately. Gradient amplifiers and their compensation are described generally in co-pending application Ser. No. 07/498,731 entitled: "Gradient Amplifier System with Flexible Amplifier Allocation" and hereby incorporated by reference.

The above description has been that of a preferred embodiment of the present invention. It will occur to those who practice the art that many modifications may be made without departing from the spirit and scope of the invention. For example, other types of RF coils may be used with the gradient coil so described and the coil may be used to image portions of the body other than the head, as described in the preferred embodiments. In order to apprise the public of the various embodiments that may fall within the scope of the invention, the following claims are made.

We claim:

1. In an MRI system having a polarizing magnet generating a substantially homogeneous magnetic field $B_0$ along a $B_0$ axis within a bore for imaging an imaged object held within the bore, a local gradient coil assembly comprising:

a coil form within the bore and defining a local imaging volume immediate to the imaged object;

an alignment means for holding the imaged object in the local imaging volume in a predetermined position with respect to the coil form;

a gradient coil affixed to the coil form for imposing a predetermined magnetic gradient along a first axis with respect to the magnetic field $B_0$ and within the local imaging volume, wherein the gradient coil is comprised of a Maxwell pair having a first and second solenoid arranged at opposing ends of the coil form and a solenoid axis coaxial with the B0 axis and interconnected with returns such that the current flow in each solenoid is countervailing and wherein the returns proceed helically around the coil form; and an RF coil affixed to the coil form for generating a radio frequency magnetic field within the local imaging volume.

2. The local gradient assembly of claim 1 wherein the returns proceed helically along the same path.

3. The local gradient assembly of claim 1 wherein the returns proceed helically an even number of full revolutions around the coil form.

4. The local gradient assembly of claim 1 wherein the gradient coil form conforms to the volume of a patient's head and includes an aperture between the first and second solenoids to permit the patient to look out from the inside of the coil form when the patient's head is within the coil form.

5. The local gradient assembly of claim 1 wherein the RF coil is operated in quadrature about the $B_0$ axis and wherein the gradient coil is substantially radially symmetric with respect to the $B_0$ axis.

6. The local gradient assembly of claim 1 wherein the RF coil is a cylindrical antenna having a plurality of axial current conducting segments and where the gradient coil windings are perpendicular to the axial segments.

7. The local gradient assembly of claim 1 wherein the alignment means is the inner surface of a tubular form within the RF coil.

8. The local gradient assembly of claim 1 wherein the alignment means includes a flexible pad.

9. In an MRI system having a polarizing magnet generating a substantially homogeneous magnetic field $B_0$ along a $B_0$ axis within a bore for imaging an imaged object held within the bore, a local gradient coil assembly comprising:
   a coil form within the bore and defining a local imaging volume conforming substantially to the imaged object;
   an alignment means for holding the imaged object in the local imaging volume in a predetermined position with respect to the coil form;
   a gradient coil affixed to the coil form for imposing a magnetic gradient along a first axis with respect to the magnetic field $B_0$ and within the local imaging volume;
   an RF coil affixed to the coil form for generating a radio frequency magnetic field within the local imaging volume; and
   wherein the coils form includes at least one tuning means for reducing the natural mechanical resonance of the coil assembly under excitation forces on the gradient coils.

10. The local gradient assembly of claim 9 wherein the tuning means are apertures cut in the coil form.

11. The local gradient assembly of claim 9 wherein the coil form is cylindrical about an axis and the tuning means are stiffening ribs attached to the coil form parallel to the axis.

12. The local gradient coil of claim 1 including a connector for connecting the gradient coil to a gradient amplifier having a first and second compensation network, the connector including means for causing the first compensation network to be selected when the connector is connected to the gradient amplifier and the second compensation network to be selected when the connector is not connected to the gradient amplifier.

* * * * *